United States Patent [19]

Livesay

[11] Patent Number: 4,528,452
[45] Date of Patent: Jul. 9, 1985

[54] ALIGNMENT AND DETECTION SYSTEM FOR ELECTRON IMAGE PROJECTORS

[75] Inventor: William R. Livesay, San Diego, Calif.

[73] Assignee: Electron Beam Corporation, San Diego, Calif.

[21] Appl. No.: 448,357

[22] Filed: Dec. 9, 1982

[51] Int. Cl.³ .......................................... H01J 37/304
[52] U.S. Cl. ............................. 250/491.1; 250/492.2
[58] Field of Search .......................... 250/491.1, 492.2

[56] References Cited

U.S. PATENT DOCUMENTS

| 3,849,659 | 11/1974 | O'Keeffe | 250/492.2 |
|---|---|---|---|
| 3,900,736 | 8/1975 | Michail et al. | 250/492.2 |
| 4,039,810 | 8/1977 | Heritage | 250/492.2 |
| 4,123,661 | 10/1978 | Wolf et al. | 250/492.2 |

Primary Examiner—Alfred E. Smith
Assistant Examiner—Jack I. Berman
Attorney, Agent, or Firm—Fulwider, Patton, Rieber, Lee & Utecht

[57] ABSTRACT

Apparatus and a corresponding method for the alignment of an electron image projected from a patterned subfield of a cathode mask, with a corresponding subfield area of a semiconductor wafer to be exposed with the image. The apparatus includes a metalic detector positioned in a parallel relationship with the wafer and electrically biased to minimize distortion of an electric field used to accelerate electrons from the mask to the wafer, and a set of alignment marks disposed about the periphery of the wafer subfield area. A projected image of corresponding alignment marks on the mask passes through an opening in the detector layer, impinges on the wafer alignments marks, and causes some electrons to be back-scattered back through the opening and onto the detector layer. Use of the alignment technique results in significantly improved overlay precision, without wastage of useful wafer area and without significant distortion of the projected images. A disclosed embodiment of the invention employs a detector layer having multiple openings, positioned over multiple wafer subfield areas, which are successively aligned with and exposed to corresponding subfields of the mask, the detector layer being then moved laterally before the alignment and exposure of additional multiple subfield areas of the wafer.

17 Claims, 5 Drawing Figures

ALIGNMENT AND DETECTION SYSTEM FOR ELECTRON IMAGE PROJECTORS

BACKGROUND OF THE INVENTION

This invention relates generally to electron image projection systems, and, more particularly, to techniques for the alignment and registration of successive lithographic layers on semiconductor devices produced in electron image projection systems. As is well known, electron beam lithography, in contrast to photolithographic techniques that employ light to define a desired pattern on a device, results in greatly improved resolution, and permits further reduction in the size of semiconductor devices. Photolithographic techniques are ultimately limited by the wavelength of the light source used.

There are two fundamentally different techniques of electron beam lithography used in the fabrication of semiconductors. First, in scanning electron beam systems, a single electron beam is deflected magnetically to impinge on desired portions of a target wafer. The beam "writes" on the wafer in somewhat the same way that an electron beam is used to form an image on a video screen.

The other technique is that of electron image projection, in which an entire pattern is projected onto the wafer as a large number of parallel electron beams. The basic approach used in electron image projection is well known. A photocathode mask, typically of glass coated with a mask pattern of titanium oxide and a thin layer of palladium over the mask pattern, is irradiated from its uncoated face by ultraviolet light. Those areas of the palladium not shielded by the titanium oxide emit electrons, which are accelerated toward the wafer by an electric field. Physical alignment of the mask and the wafer is extremely difficult, and alignment is usually accomplished by magnetically deflecting and rotating the projected electron image. Although electron image projection systems have been widely discussed in the literature and have been available for some years, they have not become widely accepted as production tools, principally because of the difficulties of achieving sufficient accuracy of alignment and registration of successive lithographic layers.

The term "alignment" has a special meaning as used in this specification, and in the integrated circuit field in general. It refers to the registration of special alignment marks on the wafer with corresponding features on a mask pattern being projected. For relatively large masks, the alignment of the marks does not necessarily ensure alignment of the entire image. Registration of other parts of a mask pattern, other than the alignment marks, is referred to as "overlay." The term "overlay accuracy" refers to the accuracy of registration of successive layers of an integrated circuit.

Electron image projection systems in the past have been able to achieve an alignment accuracy to submicron levels. However, the overlay accuracy has not been high enough for submicron imaging. In addition, the alignment marks that have to be used occupy a relatively large area of the wafer. This effectively restricts their use to single alignments per wafer exposure, unless significant areas of the wafer are set aside for alignment marks.

In scanning electron beam systems, alignment is typically achieved by detection of back-scattered or secondary electrons that emanate from alignment marks on the substrate or wafer, as a result of bombardment by the scanned electron beam. However, this approach cannot be effectively used for electron image projection systems, principally because the presence of strong electrical and magnetic fields co-axial with the original projection direction tend to confine secondary and back-scattered electrons to the substrate surface.

One prior approach to alignment for electron image projection systems is disclosed in U.S. Pat. No. 3,745,358 issued to Richard B. Firtz et al. At least two holes are formed in the wafer, and projected electron beams from the mask pass through the holes when there is perfect alignment. Detectors located beneath the holes sense the intensity of the electron beams, and appropriate control circuitry deflects the electron image to maximize output from the detectors. Although this approach was a significant improvement over the art, it does not provide the alignment sensitivity required for submicron overlay accuracy. Moreover, formation of the necessary holes in the wafers has practical difficulties, and is an additional step in the wafer production process.

U.S. Pat. No. 3,849,659 issued to Terence W. O'Keeffe discloses one approach to the use of back-scattered electrons for alignment in an electron image projection system. In O'Keefe's arrangement, several alignment marks are disposed about the periphery of the wafer, and function to back-scatter electrons toward detectors located outside the wafer periphery. Unfortunately, the technique permits the alignment marks to be located only at the wafer periphery. A back-scatter detector placed above the wafer would be in the path of the projected electrons and would distort the projected image. However, having the alignment marks placed only at the wafer periphery precludes the attainment of submicron overlay accuracy.

Another alignment technique that has been suggested involves the use of Brehmsstrahlung x-rays, and is described in a paper by Julian P. Scott, entitled "An Electron Image Projector with Automatic Alignment," IEEE Transactions on Electronic Devices, Vol. ED-22, No. 7, July 1975, pp. 409–13. Unfortunately, the detectors have to be located beneath the wafer and the x-rays are greatly attenuated by the silicon material of the wafer. Moreover, relatively large alignment marks are required, so that only a few sites on the wafer can be employed for alignment purposes, without sacrificing some of the area of the wafer available for fabrication of circuitry.

In present-day integrated circuit fabrication technology, an overlay precision of one micron in a 75 mm diameter chip has been achieved. This corresponds to a dimensional signal-to-noise ratio of approximately 1–2 parts in $10^5$. To achieve an overlay precision of 0.2 micron over a 100 mm diameter chip would require a dimensional signal-to-noise ratio of approximately two parts in $10^6$, or more than ten times the presently attainable overlay precision.

Unfortunately, overlay precision is limited by factors unrelated to the type of lithographic technique employed. Even with electron beam lithography and a highly accurate set of masks, overlay precision is still limited by the nature of the fabrication process steps that the wafer undergoes. Hot processing steps can induce anisotropic deformation of the wafer and its topology, and in some process steps there can be relative movement of crystal planes within the wafer. Consequently, perfect overlay accuracy is an impossible goal, and the fabrication industry has moved away from the technique known as "one-to-one" imaging, in which a full wafer is exposed in a single step, to systems that expose only a portion of the wafer at a time. These systems are known as "step and repeat" or "direct step on" systems, and involve the projection of only a single circuit die, or a small number of dies, at one time, with alignment being performed prior to each exposure.

With this background, it will be appreciated that there has been a significant need in the field of electon image projection systems for a technique for aligning a projected electron image with a wafer that is to be exposed on a step-and-repeat basis. Prior alignment systems can do this only at the expense of reductions in useable wafer area. Electron image projection provides a higher resolution than is available from optical techniques. However, the high resolution of electron image projection cannot be fully utilized unless mask patterns from one lithography level to the next can be accurately overlaid. Prior to this invention, there has been no technique for accurate alignment in electron image projection systems used on a subfield or step-and-repeat basis.

SUMMARY OF THE INVENTION

The present invention resides in alignment and detection apparatus, and a corresponding method, for use in an electron image projection system. Briefly, and in general terms, the apparatus of the invention includes detection means disposed above the exposed wafer surface, and having at least one opening through which primary electrons are projected and backscattered electrons may pass. The detection means of the preferred embodiment of the invention is a conductive sheet disposed in an equipotential plane in the electric field that accelerates the primary electrons toward the wafer, and electrically biased to the same voltage level as the plane, to avoid distortion of the electric field. Disposed on the wafer surface are a plurality of alignment marks from which back-scattered electrons emanate when the projected image is properly aligned with the mask.

The alignment marks can be relatively small, and are located in an unused area around each die, referred to as the kerf area. The marks are fabricated in any convenient manner that will provide a contrast with the silicon material of the wafer, and preferably take the form of a series of parallel stripes, there being corresponding stripes in the projected electron pattern. The marks can be in the form of etched grooves, or alternatively, can be formed as stripes of a material with a high atomic number, such as tantalum or tantalum oxide, both of which have a higher back-scattering coefficient than silicon.

Some of the back-scattered electrons will be recaptured by the wafer, but others will pass through the detector opening and impinge on the detector surface. In its simplest form, the detector means includes a thin metalic foil with rectangular openings just slightly larger than the projected electron pattern. The foil is connected directly to an amplifier, to obtain a measure of the flow of back-scattered electrons. The amplifier output can then be used in a conventional manner to translate and rotate the projected electron image until alignment is achieved. It will be understood that the detector may take various other forms, such as a thin photodiode material or an electron multiplier.

In terms of a novel method, the invention comprises the steps of positioning a metalic detector layer in parallel relation to the wafer, biasing the detector layer to the same potential that would have existed at the position of the layer had it not been placed there, and detecting back-scattered electrons captured by the detector layer after emanating from alignment marks on the wafer and passing through openings in the detector layer. The method may also include conventional alignment steps to bring the projected electron image into alignment with a desired subfield of the wafer, and then exposure steps to carry out a processing step of the wafer. Subsequently, the detector layer is moved to allow alignment and exposure of another subfield area of the wafer.

Although the foil could have only a single square opening, which is positioned above each wafer subfield area to be aligned and exposed, a more practical approach is to have a number of openings equal to one fourth of the number of subfield areas to be exposed on the wafer. After alignment and exposure of each successive one of the subfield areas beneath the openings, the detector foil is repositioned to align and expose another set of subfield areas. The detector foil is subsequently moved a second time and a third time before aligning and exposing the remaining sets of subfield areas of the wafer.

It will be appreciated from the foregoing that the present invention represents a significant advance in the field of electron image projection systems. In particular, the invention provides a technique for the alignment of subfield areas of a wafer, without wasting any of the available wafer area, and without distortion of the projected electron image. Other aspects and advantages of the invention will become apparent from the following more detailed description, taken in conjunction with the accompanying drawings.

DESCRIPTION OF THE PREFERRED EMBODIMENT

Figure 1:
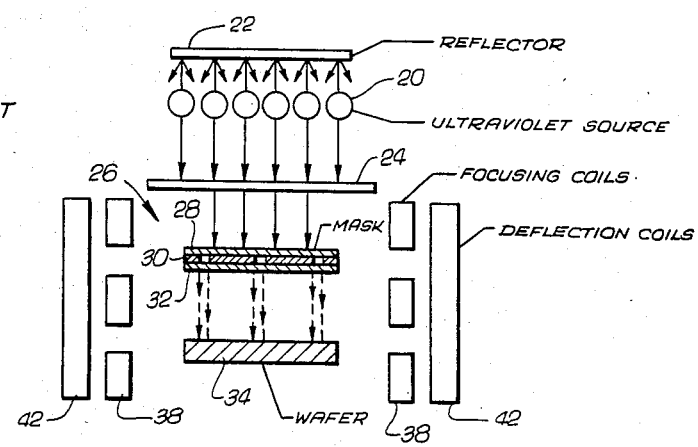
FIG. 1 is a simplified diagrammatic view of a conventional electron image projection system.

As shown in the drawings for purposes of illustration, the present invention is principally concerned with an alignment technique for use in an electron image projection system. In such a system, as shown in FIG. 1, an ultraviolet light source, indicated by reference numeral 20, with a reflector 22 above it, directs ultraviolet light through a transmitting window 24 and onto a mask, indicated generally by reference numeral 26. The mask typically includes a quartz plate 28 having a patterned layer 30 of titanium oxide or chrome on its lower surface, and thin layer 32, of a material such as palladium or cesium iodide, deposited on the titanium oxide or chrome. When the palladium is irradiated with ultraviolet light, electrons are emitted, but only from those areas not masked by the patterned layer 30. In this manner, electrons are emitted from the mask 26 in a pattern that is essentially the negative of the pattern on the titanium oxide.

The electrons emitted from the mask are accelerated by an electric field toward a wafer 34, which, in general, is a structure having various layers of semiconductive and conductive materials, formed on a substrate, usually of silicon. For electron beam lithography, the upper layer on the wafer will be a suitable electron resist material, such as polymethyl methacrylate, which depolymerizes when struck by an electron beam. In a positive electron resist material, the portions struck by electrons are removed by etching, and the remaining portions have the same pattern as that on the titanium dioxide layer of the mask 26.

For focusing the electron image, a series of focusing coils 38 are provided around the projection system. Deflection coils 43 are also disposed around the image projection system, to align the projected image in accordance with signals derived from a detection system, which is not shown in FIG. 1, but is the subject of the invention. Prior detection techniques for use with electron image projection systems cannot achieve a high degree of overlay accuracy, because they must employ detectors located at the periphery of the wafer.

Figure 2:
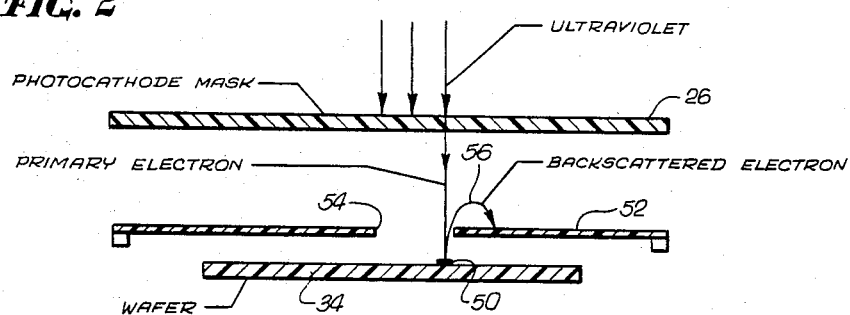
FIG. 2 is a fragmentary elevational view of an elctron image projection system, showing a thin detector film used to detect back-scattered electrons in accordance with the invention.
Figure 5:
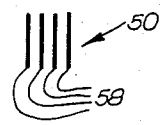
FIG. 5 is an enlarged plan view of one of the alignment marks used in the system of FIG. 2 or FIG. 3.

In accordance with the present invention, alignment marks 50 of relatively small size are located between die areas to be exposed on the wafer 34, and a detector 52 is disposed above the surface of the wafer without distoring the electric field that accelerates the primary electrons toward the wafer. As shown in FIG. 2, the detector 52 has an opening 54 in it, through which the primary electrons pass on their way to the wafer 34, and through which some back-scattered electrons pass, as shown by the path indicated at 56. In an alignment step, the only pattern projected is that of a series of alignment marks, corresponding to the marks 50 on the wafer 34. As shown diagramatically in FIG. 5, each alignment mark 50 includes either parallel score lines or stripes 58 of a material deposited on the wafer. The material must have a high atomic number, to provide a high index of back-scattering compared with that of silicon. Suitable materials are tantalum or tantalum oxide.

Some of the electrons back-scattered from the alignment marks 50 will be recaptured by the wafer, due to the strong electric field in which they are launched. Some, however, emanating at an appropriate angle to the mask surface, will pass through the opening 54 and will trace helical paths under the influence of the magnetic fields used for focusing the projected electron image, ultimately impinging on the upper surface of the detector 52. Using conventional control techniques, a signal derived from the detector 52 can be amplified and used to control the deflection coils 42, to maximize the detector output and thereby align the projected image of the alignment marks with the alignment marks 50 on the wafer 34.

Figure 3:
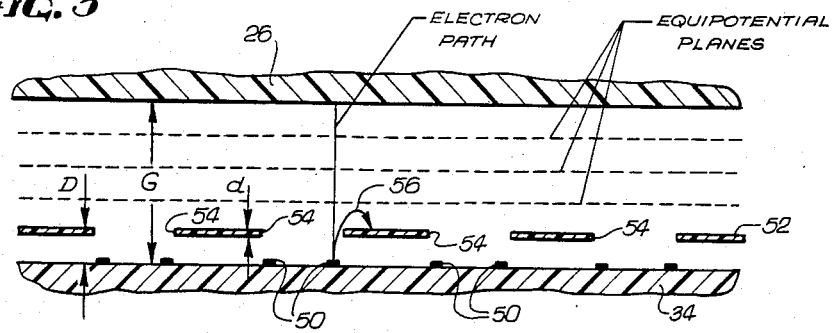
FIG. 3 is an elevational view similar to FIG. 2, but showing how the detector film is positioned in an equipotential plane.

As shown in FIG. 3, the foil detector 52 has to be positioned in an equipotential plane, and should be electrically biased to the same potential that would have existed at that plane had the foil not been disposed there. The bias voltage applied to the detector foil should be:

$$V_D = (D/G)V_C,$$

where:
$V_D$ = the detector bias voltage,
$V_C$ = the cathode (mask) voltage,
D = the distance from detector to wafer
and
G = the distance from mas to wafer.

It is important that the detector 52 be as thin as possible, to minimize distortion of the projected electron image. The futher that the detector 52 is located from the wafer 34, the thinner it must be to meet the same image distortion requirements.

Another important advantage of the invention is that the detector performs the additional function of intercepting back-scattered electrons that would otherwise be recaptured by the wafer. It has been recognized that re-impacting back-scattered electrons have an adverse effect on the electron resist layer of the wafer, since the points of impact are basically random in nature.

Figure 4:
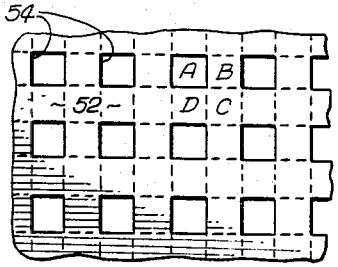
FIG. 4 is a diagrammatic plan view of the detector film shown in FIG. 3.

As shown in FIGS. 3 and 4, the detector 52 preferably has a plurality of openings 54, located over alternate subfield areas in both a row-wise and columnwise sense. Thus the number of openings 54 is equal to one quarter of the number of subfield areas to be exposed on the wafer 34. In accordance with this aspect of the invention, each of the subfield areas of the wafer in the first of the four sets of such areas is successively aligned and exposed. In the alignment step, the ultraviolet light source 20 is selectively illuminated, first to project only the alignment marks of a first of the subfield areas. When this first subfield area is aligned, the entire pattern for the same subfield area is projected. Each subfield area is aligned and exposed in the same fashion, until all the areas in the first set have been exposed.

Next, the detector foil 52 is moved laterally until the openings are aligned with a second set of the four sets of subfields to be exposed. For example, the foil 52 is moved to the right until the opening over position A is centered over position B. The steps of alignment and exposure of the successive subfields are repeated until all of the subfields of the second set have been exposed. This same procedure is then followed for the third and fourth sets of subfields, indicated by positions C and D, thereby completing exposure of the entire wafer.

Since each subfield of the wafer is separately aligned before exposure, the overlay precision is greatly improved in comparison to that of systems using other alignment techniques. In numerical terms, the overlay precision can be expected to be improved by a factor approximating the number of subfields occurring along a diameter of the wafer.

Although the detector has been described above as a thin metalic foil, other equivalent structures may be used. For example, an appropriately coated sheet of plastic, such as polyimide coated with a metalic film, may serve as a detector. An alternative structure detector is a microchannel plate, to take advantage of an electron multiplication effect. Although the microchannel plate has greater thickness than the foil, it can be appropriately biased to approximate the field gradient of the image projector.

It will be appreciated from the foregoing that the present invention represents a significant advance in the field of electron image projection systems. In particular, the invention provides a novel technique for aligning a projected electron image with a wafer on which successive processing steps have to be performed in exact registration, on a subfield basis. The technique not only results in significantly improved overlay precision, needed to fully utilize the capabilities of electron image projection systems, but also improves operation of such systems by reducing the number of back-scattered electrons recaptured by the wafer surface.

It will also be appreciated that, although a specific embodiment of the invention has been described in detail for purposes of illustration, various modifications may be made without departing from the spirit and scope of the invention. Accordingly, the invention is not to be limited except as by the appended claims.

I claim:

1. Alignment apparatus for use in an electron image projection system having a mask bearing patterns in a plurality of separate subfield areas, means for supporting a semiconductor wafer on which a like plurality of subfield areas are to be exposed to bombardment of electrons in patterns corresponding to the mask patterns, means for generating a magnetic field between the mask and the wafer to move the electron patterns relative to the wafer, and means for applying an electric field between the mask and the wafer to accelerate electrons in the desired pattern from the mask toward the wafer, the electric field extending all the way to the wafer, the electric field and the magnetic field both occupying substantially the same space, said alignment apparatus comprising:
   a plurality of alignment marks disposed on the wafer around each of the subfield areas thereof;
   a plurality of corresponding alignment features in the mask pattern, to produce an alignment pattern of electrons for registration with said alignment marks; and
   detection means disposed in an equipotential plane between the wafer and the mask, and having at least one opening therethrough for the passage of primary electrons toward the wafer and the return of backscattered electrons emanating from said alignment marks.

2. Apparatus as set forth in claim 1, and further including:
   means for electrically biasing said detection means to the same potential that would obtain if said detection means were not present in the electric field between the mask and the wafer.

3. Apparatus as set forth in claim 1, wherein:
   said detection means includes a sheet of conductive foil held in a parallel relationship with the wafer surface.

4. Apparatus as set forth in claim 1, wherein:
   said alignment marks are formed as a set of parallel lines etched in the surface of the wafer.

5. Apparatus as set forth in claim 1, wherein:
   said alignment marks are formed as parallel strips of a coating of material of relatively high atomic number.

6. Apparatus as set forth in claim 1, wherein:
   said detection means includes a plurality of openings, each positioned over a different subfield area of the wafer, whereby the subfield areas beneath said openings may be separately aligned and exposed, before moving said detection means to a new position in which said openings are positioned over a different set of subfield areas of the wafer.

7. Apparatus as set forth in claim 1, wherein said detection means detects back-scattered electrons in some predefined modulation pattern when the projected pattern of electrons is properly aligned with the wafer.

8. For use in an electron image projection system having an electric field for accelerating electrons, alignment apparatus comprising:
   a plurality of alignment marks disposed on a semiconductor wafer around each of a plurality of subfield areas of the wafer;
   a plurality of corresponding alignment features in a patterned mask, to produce an alignment pattern of electrons for registration with said alignment marks; and
   detection means disposed in an equipotential plane in the electric field extending all the way between the wafer and the mask, and having at least one opening therethrough for the passage of primary electrons toward the wafer and the return of backscattered electrons emanating from said alignment marks.

9. Apparatus as set forth in claim 8, wherein said detection means detects back-scattered electrons in some predefined modulation pattern when the projected pattern of electrons is properly aligned with the wafer.

10. Apparatus as set forth in claim 8, and further including:
    means for electrically biasing said detection means to the same potential that would obtain if said detection means were not present in the electric field between the mask and the wafer.

11. Apparatus as set forth in claim 8, wherein:
    said detection means includes a sheet of conductive foil held in a parallel relationship with the wafer surface.

12. Apparatus as set forth in claim 8, wherein:
    said alignment marks are formed as a set of parallel lines etched in the surface of the wafer.

13. Apparatus as set forth in claim 8, wherein:
    said alignment marks are formed as parallel stripes of a coating of material of relatively high atomic number.

14. Apparatus as set forth in claim 8, wherein:
    said detection means includes a plurality of openings, each positioned over a different subfield area of the wafer, whereby the subfield areas beneath said openings may be separately aligned and exposed, before moving said detection means to a new position in which said openings are positioned over a different set of subfield areas of the wafer.

15. For use in an electron image projection system having an electric field for accelerating electrons, the electric field having equipotential planes parallel to a wafer to be exposed and extending to the wafer, a method for the alignment of a projected subfield mask image with the corresponding subfield of the wafer, said method comprising the steps of:
    positioning an electrically conductive detector layer in parallel relation to the wafer, the detector layer having an opening at a position corresponding to the subfield of the wafer to be exposed;
    biasing the detector layer to the same electric field potential that existed at the position of the layer before said positioning step;
    projecting through the opening an electron image of alignment marks spaced about the periphery of the subfield mask image;
    detecting back-scattered electrons that emanate from alignment marks spaced about the periphery of the wafer subfield before impinging on the detector layer; and deflecting the projected electron image of the alignment marks to achieve a predefined modulation of an electrical signal derived from said detecting step.

16. A method as set forth in claim 15, and further including the step of:
projecting the subfield mask image, to expose the wafer subfield to a projected pattern of electrons corresponding to the subfield mask image.

17. A method as set forth in claim 16, wherein:
the detector layer has a plurality of openings located at positions corresponding to a plurality of wafer subfields;
said steps of projecting the image of the alignment marks, detecting back-scattered electrons, deflecting the projected image, of the alignment marks, and projecting the subfield mask image are performed repeatedly for successive subfields in the positions corresponding to the openings in the detector layer;
said method further includes the steps of
moving the detector layer laterally to a new position such that the openings are positioned adjacent to a different set of wafer subfields,
repeating said steps of projecting the image of the alignment marks, detecting the backscattered electrons, deflecting the image of the alignment marks, and projecting the subfield mask image, for each wafer subfield in the different set of wafer subfields, and
performing said moving and repeating steps again until all of the wafer subfields have been exposed to a projected subfield mask.

* * * * *